United States Patent [19]

d'Angeac et al.

[11] Patent Number: 4,597,042
[45] Date of Patent: Jun. 24, 1986

[54] DEVICE FOR LOADING AND READING STRINGS OF LATCHES IN A DATA PROCESSING SYSTEM

[75] Inventors: Didier D. d'Angeac, Caros; Michel A. Lechaczynski, Nice; André Pauporte, La Colle sur Loup; Pierre Thery, Juan les Pins, all of France

[73] Assignee: International Business Machines Corporation, Armonk, N.Y.

[21] Appl. No.: 533,188

[22] Filed: Sep. 19, 1983

[30] Foreign Application Priority Data

Sep. 28, 1982 [EP] European Pat. Off. ........ 82430028.9

[51] Int. Cl.⁴ .................... G06F 11/00; G01R 31/28
[52] U.S. Cl. .................................. 364/200; 371/25; 324/73 R
[58] Field of Search ... 364/200 MS File, 900 MS File; 371/25, 21, 15, 26, 72; 324/73 R, 73 AT

[56] References Cited

U.S. PATENT DOCUMENTS

| | | | |
|---|---|---|---|
| 3,964,088 | 6/1976 | Ducrocq et al. | 340/172.5 |
| 4,023,142 | 5/1977 | Woesmer | 364/200 |
| 4,030,072 | 6/1977 | Bjornsson | 364/200 |
| 4,041,471 | 8/1977 | Krossa et al. | 364/200 |
| 4,167,041 | 9/1979 | Curlander et al. | 364/900 |
| 4,183,461 | 1/1980 | Sato | 235/304 |
| 4,268,902 | 5/1981 | Berglund et al. | 364/200 |
| 4,298,980 | 11/1981 | Hajdu et al. | 371/25 |
| 4,326,266 | 4/1982 | Davis et al. | 364/900 |
| 4,476,431 | 10/1984 | Blum | 371/25 X |

OTHER PUBLICATIONS

"Design for Testability of the IBM System/38", L. A. Stolte & N. C. Berglund, 1979 IEEE Test Conference, Cherry Hill, NJ, pp. 29–36.

"Level-Sensitive Scan Design Tests Chips, Boards, System", N. C. Berglund, Electronics, Mar. 15, 1979, pp. 108–110.

*Primary Examiner*—David Y. Eng
*Attorney, Agent, or Firm*—Wesley DeBruin; Mitchell S. Bigel

[57] ABSTRACT

A device for loading data in and reading data out of latch strings located in field replaceable units containing the circuitry of a data processing system realized in accordance with the Level-Scan Sensitive Design (LSSD) technique. Each field replaceable unit includes an addressing circuit. The addressing circuits are interconnected by a monitoring loop over which a configuration of address bits is serially transmitted by a control circuit. The data to be loaded and read out propagate in a data loop and are entered in a latch string under control of the addressing circuit.

9 Claims, 5 Drawing Figures

DEVICE FOR LOADING AND READING STRINGS OF LATCHES IN A DATA PROCESSING SYSTEM

DESCRIPTION

1. Technical Field

This invention relates to a device for loading data in, and reading data out of a plurality of latch strings which are contained in a data processing system for testing, failure isolating and initializing purposes. More particularly, this invention relates to such a device operable to transmit test or initialization data to a plurality of latch strings in a system realized in accordance with the Level-Sensitive Scan Design (LSSD) technique.

2. Background Art

As indicated in an article appearing in *Electronics*, Mar. 15, 1979, pages 108–110, the increasing degree of circuit integration in data processing systems has made it necessary to design the circuits to permit testing during debug of prototype hardware, later during manufacturing, and subsequently in field service at the customer's site when failures must be isolated. The LSSD technique described in this article facilitates testing and initializing the circuits.

In data processing systems that use the LSSD approach, the logic circuits are integrated circuits provided in chips that are mounted on cards plugged into boards. As stated in the above cited article, it is necessary, in order to test a chip, to transmit and receive input and output scan data, termed SDI and SDO, and to transmit clock signals from a centralized control circuit.

Storage elements, SRL, consisting each of a pair of latches, L1 and L2, connected as described in said article, are linked in a test mode, called LSSD mode hereinafter, to form a string of latches comprising a shift register. Depending upon the type of faulty component it is desired to isolate, the strings may be comprised of the latches formed in a given chip or of those provided in components such as cards or boards. The component it is desired to isolate will be called field replaceable unit (RU) hereinafter.

In those machines which include a large number of circuits, many latch strings must be formed for test purposes. The centralized control circuit must therefore be able to supply each latch string with test data. As a result, each string must be provided with four input/output pins and four lines, namely, SDI, SDO, clock A and clock B. The centralized control circuit usually takes the form of a VLSI circuit which should be provided, in accordance with the current trend, with a minimal number of input/output pins. While the addition of a few circuits will only slightly increase the cost of the machine, it is very costly to provide many input/output pins on the integrated circuit chips and many cables to carry the signals.

U.S. Pat. No. 4,268,902 describes a maintenance interface for testing a number of components of a central processing unit. To this end, four strings of shift registers are formed and the control logic circuitry includes four groups of SDI and SDO lines. In view of the limited number of strings, the number of input/output pins is not very high, but would be considerable in a large size machine in which many chips mounted on cards are used, as schematically shown in FIG. 1.

It is, therefore, an object of the invention to provide a device for loading data in and reading data out of latch strings in a data processing system, for test, diagnostic or initialization purposes, with the loading and reading of data being effected from a centralized control circuit that includes a minimal number of input/output pins.

DISCLOSURE OF THE INVENTION

The invention relates to a device for loading data in and reading data out of strings of shift register latch strings for the purposes of testing, troubleshooting and initializing a data processing system the circuitry of which is provided on n field replaceable units each of which includes p strings of latches. The device includes a control circuit connected to a monitoring loop and to a data loop.

The control circuit generates a configuration of address bits and processes the data to be sent to a selected string and the data received therefrom.

The monitoring loop is connected to the control circuit and receives therefrom a configuration of address bits that are sent serially over the loop.

Each field replaceable unit includes an addressing circuit which responds to the configuration of address bits sent over the monitoring loop. The addressing circuit has p outputs and provides a string selection signal at one of the p outputs, which is determined by the configuration of address bits.

All field replaceable units are also connected to the data loop. They receive from the control circuit, through the data loop, the data to be loaded in the selected string and transmit the data read out of said string.

Each field replaceable unit further includes a first group of p input gates, each of which is connected to one of the p outputs of the addressing circuit and is activated by the address selection signal to enable data to be loaded in the selected string.

In a preferred embodiment, each addressing circuit includes m addressing latches, with $p=2^m$, the m latches of all circuits being interconnected to form a shift register, and a string selector provided with p outputs that are responsive to the state of the addressing circuits to supply the address selection signal at one of the p outputs.

The control circuit also includes first clock pulse generating means for sending first clock pulses over a first control circuit output line, the number of which is dependent upon the unit that contains the string to be selected, said pulses being applied in parallel to the addressing latches to cause the configuration of address bits to be shifted in the register formed by the addressing latches.

The control circuit further includes second clock pulse generating means for sending second clock pulses over a second control circuit output line when the string to be selected has been addressed. The second clock pulses are applied to each of the p input gates in all field replaceable units and are passed through the particular gate activated by the addressing circuit to the selected string to load therein the data circulating in the data loop.

Each field replaceable unit includes a second group of p output gates, each of which is activated by one of the outputs of the addressing circuit to cause the contents of the selected string to be sent over the data loop.

BRIEF DESCRIPTION OF THE DRAWINGS

These and other objects, features and advantages of the invention will be apparent from the following more particular description of the preferred embodiments these of as illustrated in the drawings.

BEST MODE FOR CARRYING OUT THE INVENTION

Figure 1:
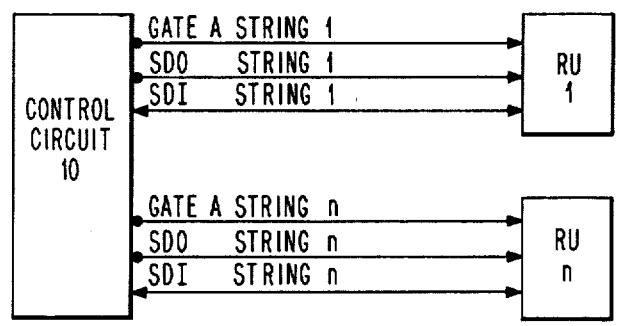
FIG. 1 is a schematic diagram of a prior art system.

FIG. 1 shows the main drawback of prior art data processing systems. Control circuit 10, which includes clock control means and conventional means for transmitting and receiving data in LSSD mode, is provided, for each field replaceable unit RU (a printed circuit card, in this example), with a data input line in LSSD mode, SDI, a data output line in LSSD mode, SDO, and a clock A control line labeled GATE A. Accordingly, control unit 10 must be provided with a great many input/output pins if a large number, n, of RU's are connected thereto. It is assumed that, in this data processor, the B clock signals are permanently generated.

Figure 2:
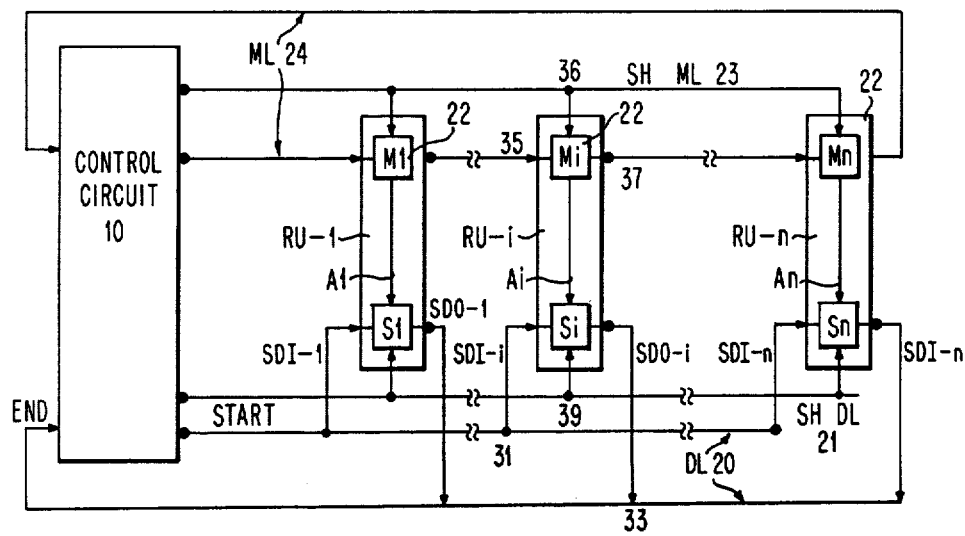
FIG. 2 is a schematic diagram of the device of the invention.

As shown in FIG. 2 LSSD data is transmitted and received, as in the prior art, by the control circuit 10, under control for example of a microprocessor. In the units to be tested or initialized in LSSD mode, RU1—RUn, strings, S1–Sn, of shift register latches (SRL) are formed. The data is loaded in the LSSD strings under control of clock A. In FIG. 2, only one string has been schematically shown in each RU. However, each RU could include several strings, as will be described in relation to FIG. 4.

The input data is sent over a data loop DL 20 and fed to the various RU's via the SDI lines. The output data is placed on the loop by the RU's via the SDO lines under control of the clock A signals applied to a data shift control line SH DL 21.

Each field replaceable unit RU-i is provided with an addressing circuit Mi 22 which includes at least one latch. Each such latch receives clock pulses from control circuit 10 via line SH ML 23. The latches in all addressing circuits are linked by a monitoring loop ML 24 to form a shift register. The state of the latches in addressing circuit Mi 22 is dependent upon the information sent over monitoring loop ML 24 by control circuit 10. Depending upon the state of the latches, the loading of data in a selected string is enabled. This is schematically represented in the figure by the line Ai 25 provided in each RU. Means for sending the information required for addressing each RU over monitoring loop ML 24 will be described later in relation to FIG. 5.

By using the arrangement of the present invention, as shown in FIG. 2, control circuit 10 need only be provided with six input/output pins to test n RU's, versus 3xn in prior art systems of the type illustrated in FIG. 1. This pin saving becomes significant as the number n or RU's increases.

Figure 3:
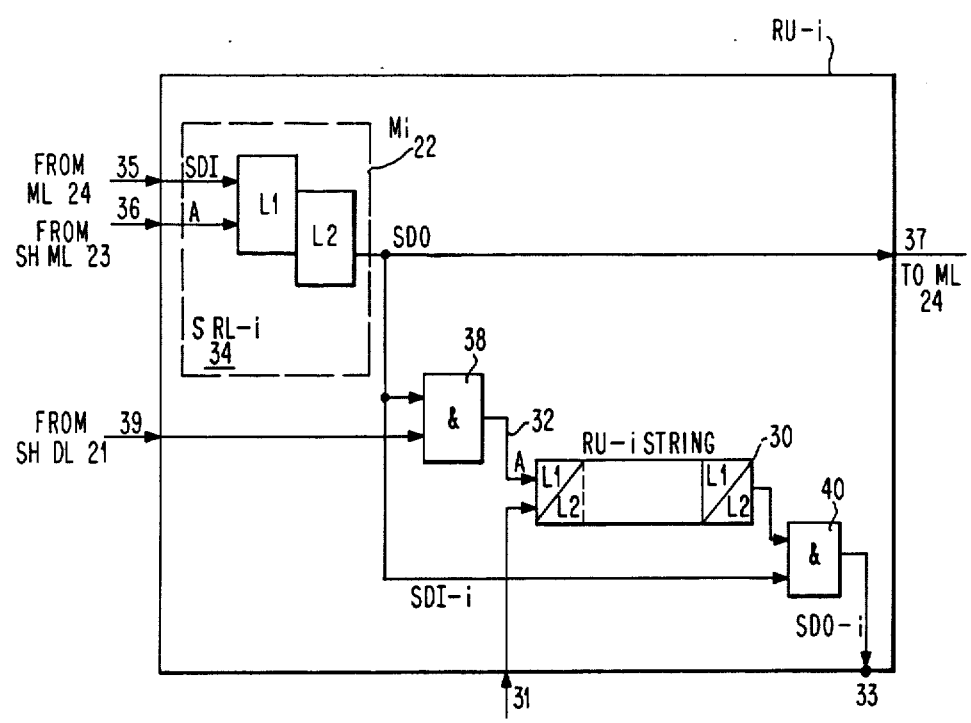
FIG. 3 shows a field replaceable unit that contains a single string of latches and is to be tested in accordance with the principles of the invention.

FIG. 3 shows a field replaceable unit RU-i that includes a single string of latches. In FIG. 3, reference numerals 31, 33, 35, 36, 37 and 39 show the manner in which unit RU-i is connected in the arrangement FIG. 2.

Referring to FIG. 3, the string of latches formed in unit Ru-i to test its logic is schematically shown at 30. This string is a shift register, each stage of which comprises a pair of latches L1, L2 arranged as shown in the article referred to earlier. The test data in LSSD mode, as received at input 31 of unit RU-i, is serially fed to input pin SDI-i and shifted through the register under control of a clock signal applied to the input A 32 of each latch. The output data to be used for test purposes or for isolating a failure, as obtained at output pin SDO-i, is available at output 33.

The addressing circuit Mi of FIG. 3 is one-stage shift register, SRL-i 34, comprising two latches L1, L2. The address information circulating in monitoring loop ML 24 and received at input 35 of unit RU-i (FIG. 2) is applied to input SDI of latch L1. A clock signal received at input 36 of unit RU-1 is applied to input A of latch L1 to set SRL-i 34 whenever unit RU-i is addressed or to propagate said information to the next SRL stages for addressing another RU selected by control circuit 10. Output SDO of latch L2 is received at output 37 of unit RU-i and applied to input SDI of latch L1 in the next unit to form monitoring loop ML 24.

An AND gate 38 has one of its inputs connected to output SDO of addressing circuit 34 and has its other input connected to shift control line SH DL 21 to receive, via input 39 of unit RU-i, the A clock signal generated in control circuit 10 when the system is in LSSD mode. Consequently, if control circuit 10 has caused unit RU-i to be addressed by setting latch SRL-i 34, then the A clock signal sent by control circuit 10 over shift control lien SH DL 21 is gated through AND gate 38 to RU-i string 30. The data present on data loop DL 20, as obtained at RU-i input 31, is thus loaded in string 30 via input line SDI-i.

An AND gate 40 receives as a first input the output of latch L2 in the last stage of string 30 and as a second input the output SDO of addressing latch 34. Consequently, when unit RU-i has been addressed, the data to be processed is obtained at output SDO-i of AND gate 40 and returned, via output 33 of RU-i, to control circuit 10 through data loop DL 20.

Figure 4:
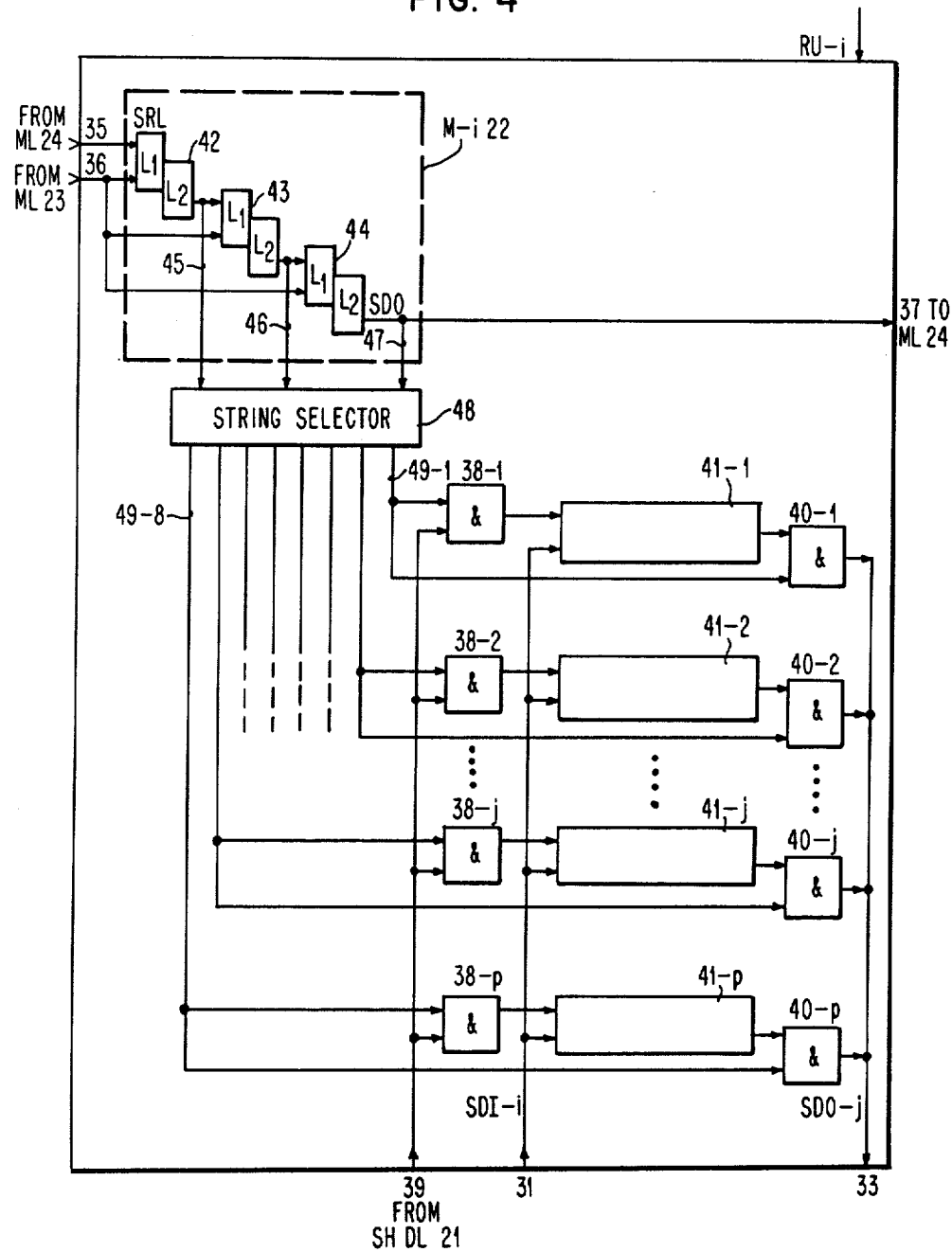
FIG. 4 shows a field replaceable unit that contains several strings of latches.

Referring now to FIG. 4, the manner in which the principles discussed in relation to FIGS. 2 and 3 can be applied for testing several strings of latches within each unit RU-i will be described. It will be supposed that it is desired to access several strings of latches 41-1 to 41-p in each unit RU-i. In FIG. 4, only four strings are shown. By way of example, it will be supposed that p=8.

The unit RU-i is connected to monitoring loop ML 24 and to data loop DL 20 in the same manner as in the previous example described in relation to FIG. 3. Accordingly, the same reference numerals are used to denote the input/output terminals of RU-1. Data is loaded in and read out of the strings in the manner previously described. For each string 41-j, two AND gates 38-j and 40-j, connected in the same manner as AND gates 38 and 40 of FIG. 3, are provided. However, the addressing circuit which activates the gates is different.

The addressing circuit Mi includes several SRL latches. Three SRL latches 42, 43, 44, are shown in FIG. 4. These provide on their output lines 45, 46, 47 three address bits, thereby enabling eight strings to be addressed. The number m of latches is dependent upon the number p of strings to be addressed and is such that $p = 2^m$.

The first latch has its input SDI connected to loop ML 24 at 35. Each clock A input of latches 42, 43, 44 receives a shift pulse from control circuit 10 via line SH ML 23 at 36. The output SDO 37 of latch 44 is connected to the input SDI of the first latch, 42, of the next unit via loop ML 24.

The three address bits are applied to a string selection circuit 48 comprised of a set of gates and inverters and which provides on one of its output lines 49-1 to 49-8 a string selection signal, depending upon the configuration of address bits present on output lines 45, 46, 47. For example, when this configuration is 000, only the signal present on output lines 49-1 is high to enable gate 38-1, and when it is 111, only the signal present on line 49-8 is high to enable gate 38-p (assuming that p=8). Once a string has been selected, the data is loaded therein as in the arrangement of FIG. 3.

Since the output AND gates 40-1 to 40-p are enabled by the string selection signal, only the output data from the selected string is present on line SDO-i at 33. This data travel back to control circuit 10 over data loop DL 20 as explained in relation to FIG. 2.

Figure 5:
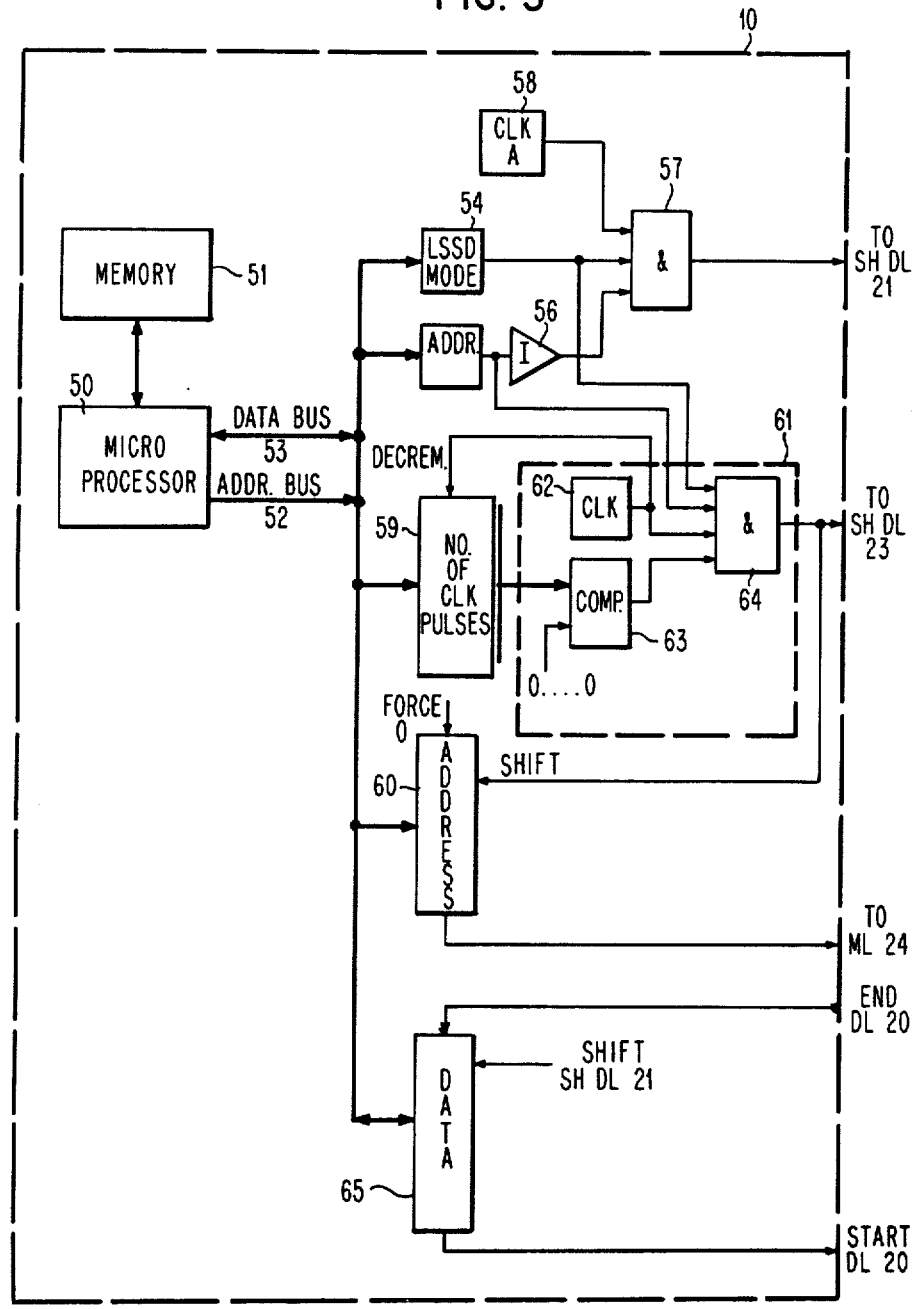
FIG. 5 shows that part of the control circuit which is necessary to enable the device of the invention to operate.

Referring now to FIG. 5, there will be described that part of the control circuit 10 which is used to transmit the address information over monitoring loop ML 24, assuming that several strings of latches are to be addressed in each unit.

In a preferred embodiment, the control circuit is comprised of a microprocessor 50 in the memory 51 of which the control program and the data are stored. The microprocessor communicates with external circuits by means of external registers that are addressed under control of the program via address bus 52. Data is transferred to the addressed register via data bus 53. Five external registers 54, 55, 59, 60 and 65 are schematically shown in FIG. 5. The first register 54 is essentially comprised of a single latch which is set when the system is placed in LSSD mode. The second register 55 comprises another latch, which is set during the addressing phase. The output of the latch in register 55 is inverted by the inverter 56. An AND gate 57 has an input connected to latch 54 and receives as another input the clock A signal from clock 58, which signal is used to control the latches in the various strings. This same signal is gated to data line SH DL 21 in LSSD mode when the addressing phase is over.

Register 59 is loaded with information that indicates, depending upon which of the units RU is selected, the number of clock pulses to be sent over line SH ML 23. For example, in order to address unit RU-i, assuming that each addressing circuit 22 comprises m latches to address p strings in each unit, ixm clock pulses will be required.

Register 60 is loaded with address bits indicating a specific string to be addressed in the selected unit. The contents of this register are serially transmitted over monitoring loop ML 24 under control of the clock pulses present on line SH ML 23.

Zeros are forced into the register after each shift through the "Force 0" input so that after m clock pulses (m=3 in this example) the contents of register 60 will be "all zeros" and zeros will be sent over the line.

The clock pulses present on line SH ML 23 are generated from the contents of register 59 by a control circuit 61 that comprises a clock 62, a comparator 63 and an AND gate 64 that is enabled in the LSSD and Addressing modes. Whenever a clock pulse is applied to a "Decrementation" input of register 59, the contents thereof are decremented by 1.

Initially, the contents of register 59 are "all zeros" and comparator 63, which compares the contents of the register with an all-zero configuration, provides a signal that deactivates AND gate 64, so that no pulses are applied to output line SH ML 23.

When register 59 is loaded with the required value to address a given unit, say "9" (001001) to address the third unit, assuming that each unit includes three addressing latches as shown in FIG. 4, comparator 63 enables AND gate 64 which applies the clock pulses to line SH ML 23. Each pulse causes the contents of register 59 to be decremented by one so that after nine pulses the contents of the register will be "all zeros" and no further pulses will be applied to line SH ML 23.

These pulses cause the contents of register 60 to be shifted, one bit at a time, and sent over line ML 24. The last three clock pulses present on line SH ML 23 cause the bit configuration to be entered in the three addressing latches (42 to 44) of the selected unit. The addressing phase is then completed and latch 55 is reset to zero, thereby causing the clock A pulses to be applied to line SH DL 21.

The data to be transmitted to the string thus selected is placed in register 65 to be sent serially over loop DL 20 from the "Start" pin. The data extracted from the selected string after it has been shifted, as provided at pin SDO, is available at 33 and applied again to register 65. When all test data has been transmitted, the contents of register 65 are read out under program control and transferred to the microprocessor to be processed.

In each unit, the string of addressing latches is restored by sending over line SH ML 23 a number nxm of clock pulses that corresponds to the addressing of the last unit, and by loading a configuration of address bits 0 0 0 ... in register 60.

Where data is to be loaded in and read out of a single string, that string is addressed and data is loaded and read out in the manner previously described. The latches may then be restored by sending the required number of zeros over the control loop.

Where data is to be loaded in and read out of all strings, one may for example address all strings of identical order in all units by loading the applicable string number say "100" (string number 2), in register 60 without forcing zeros therein and by sending over line SH ML 23 three clock pulses every time data is loaded or read out, thereby causing the address information to propagate in the monitoring loop. Thus, all strings can be addressed sequentially without having to reset the latches.

Of course, the addressing circuit could comprise a number of latches corresponding to the number of strings in each unit, with a given latch allowing a given string to be selected. In that case, the configuration of address bits would not be coded and register 60 would have to comprise p positions to permit sending an address configuration of p bits to determine the state of the p addressing latches, and the number of clock pulses required to propagate the desired bit configuration would be much larger, so that the addressing operation would take longer to complete.

The above procedure for addressing the various units has a further advantage in that units can be added or removed as desired without having to modify the circuitry. All that is required in such cases is to change the number of clock pulses sent over lines SH ML 23.

While the invention has been particularly shown and described with reference to the preferred embodiments thereof, it will be understood by those skilled in the art that various changes in form and details may be made therein without departing from the spirit and scope of the invention.

What is claimed is:

1. In a data processing system, the circuitry of which is contained on a plurality of field replaceable units, each field replaceable unit including at least one shift register latch string operable for testing and initializing the field replaceable unit, an apparatus for loading data in and reading data out of selected ones of said shift register latch strings comprising:
    an addressing circuit in each field replaceable unit, responsive to a unique configuration of address bits for providing a shift register latch string selection signal for a shift register latch string on the associated field replaceable unit;
    a control circuit for generating configurations of address bits for addressing any one of said addressing circuits and for generating the data to be loaded into and receiving data read from any one of said shift register latch strings;
    a single monitoring loop serially connecting said control circuit and said addressing circuits, for transmitting a generated configuration of address bits from said control circuit to said addressing circuits; and
    a single data loop serially connecting said control circuit and said shift register latch strings, for transmitting data to be loaded into a selected shift register latch string from said control circuit and for transmitting data read out of the selected shift register latch string to said control circuit; and,
    said apparatus being further characterized by requiring and utilizing only said single monitoring loop for transmitting said generated configuration of address bits, and only said single data loop for transmitting data to and from said selected shift register latch string,
    whereby said plurality of field replaceable units can be tested and initialized from said control circuit using a minimal number of control circuit input/output lines.

2. The apparatus of claim 1 wherein each addressing circuit comprises one or more latches, with all the latches of all the circuits being interconnected to form a shift register.

3. The apparatus of claim 2 wherein said data processing system includes n field replaceable units, each of which includes p strings of shift register latches, and wherein each addressing circuit comprises m latches, with $p = 2^m$, the m latches of all circuits being interconnected to form a shift register, and a p-output string selector responsive to the state of the addressing latches to provide a string selection signal at one of the p outputs.

4. The apparatus of claim 2 wherein said control circuit further includes first clock pulse generating means for generating first clock pulses the number of which depends upon the field replaceable unit in which the shift register latch string to be selected is located, and wherein said apparatus further includes a first output line, connected in parallel between said first clock pulse generating means and the addressing latches, for causing the configuration of address bits to be stepped through the shift register formed by the addressing latches.

5. The apparatus of claim 2 wherein said data processing system includes n field replaceable units and each addressing circuit comprises m latches and said control circuit further includes first clock pulse generating means for generating first clock pulses the number of which is equal to mxi, with i being in the range of 1 to n, when the shift register latch string to be selected is located in the $i^{th}$ field replaceable unit, and wherein said apparatus further includes a first output line, connected in parallel between said first clock pulse generating means and the addressing latches, for causing the configuration of address bits to be stepped through the shift register formed by the addressing latches.

6. The apparatus of claim 4 wherein said control circuit further includes second clock pulse generating means for generating second clock pulses when the shift register latch string to be selected has been addressed, and wherein said apparatus further includes a second output line, connected in parallel between said second clock pulse generating means and each string of shift register latches to cause the data propagating in the data loop to be stored in the selected shift register latch string.

7. The apparatus of claim 2 wherein each field replaceable unit further includes at least one output gate each of which is activated by the associated addressing circuit for transferring the contents of the selected shift register latch string to the data loop.

8. The apparatus of claim 2 wherein said configuration of address bits comprises m bits representing the binary coded number, i, of the string to be addressed, preceded by $(i-1) \times m$ zeros.

9. In a data processing system, the circuitry of which is contained on a plurality of field replaceable units,
    each field replaceable unit including at least one shift register latch string operable for testing and initializing the field replaceable unit, each of said field replaceable units including an addressing circuit responsive to a unique configuration of address bits for providing a shift register latch string selection signal for a shift register latch string on the associated field replaceable unit, an apparatus for loading data in and reading data out of selected ones of said shift register latch strings, said apparatus comprising:
    a control circuit for generating configurations of address bits for addressing any predetermined one of said addressing circuits of said plurality of field replaceable units, said control circuit also generating the data to be loaded into or received from any predetermined one of said shift register latch strings of said at least one shift register latch string of said predetermined one of said plurality of field replaceable units;
    a single monitoring loop serially connecting said control circuit and each of said addressing circuits of said plurality of field replaceable units, said monitoring loop transmitting a generated configuration of address bits from said control circuit to said addressing circuits of said plurality of field replaceable units; and
    a single data loop serially connecting said control circuit and said shift register latch strings of said plurality of field replaceable units, said data loop transmitting data to be loaded into said predetermined selected shift register latch string from said control circuit and transmitting data read out of the predetermined selected shift register latch string to said control circuit;

first clock pulse generating means included within said control circuit, said first clock pulse generating means providing first clock pulses the number of which depends upon the field replaceable unit in which the shift register latch string to be selected is located, said first clock pulse generating means having an output connected via an output line to each addressing circuit of said plurality of field replaceable units; and second clock pulse generating means included within said control circuit, said second clock pulse generating means providing second pulses when the shift register latch string to be selected has been addressed, said second clock pulse generating means having an output connected via an output line to each of said latch strings of said plurality of field replaceable units, said second clock pulse causing the data propagating in the data loop to be stored in the selected shift register latch string, whereby said plurality of field replaceable units can be tested and initialized from said control circuit using a minimal number of control circuit input-/output lines, where said input/output lines comprise said single monitoring loop, said single data loop, said output line of said first clock pulse generating means and said output line of said second clock pulse generating means.

* * * * *